(12) United States Patent
Hassan

(10) Patent No.: US 9,841,914 B2
(45) Date of Patent: Dec. 12, 2017

(54) MANAGED ENERGY-EFFICIENT HYBRID MAIN MEMORY SYSTEMS

(71) Applicant: SAP SE, Walldorf (DE)

(72) Inventor: Ahmad Hassan, Belfast (GB)

(73) Assignee: SAP SE, Walldorf (DE)

( * ) Notice: Subject to any disclaimer, the term of this patent is extended or adjusted under 35 U.S.C. 154(b) by 191 days.

(21) Appl. No.: 14/704,461

(22) Filed: May 5, 2015

(65) Prior Publication Data
US 2016/0328169 A1    Nov. 10, 2016

(51) Int. Cl.
| | | |
|---|---|---|
| G11C 14/00 | (2006.01) | |
| G11C 13/00 | (2006.01) | |
| G06F 3/06 | (2006.01) | |
| G11C 7/10 | (2006.01) | |

(52) U.S. Cl.
CPC ............ *G06F 3/0625* (2013.01); *G06F 3/065* (2013.01); *G06F 3/0619* (2013.01); *G06F 3/0685* (2013.01); *G11C 7/1072* (2013.01); *G11C 14/0045* (2013.01); *G11C 13/0004* (2013.01); *Y02B 60/1225* (2013.01)

(58) Field of Classification Search
None
See application file for complete search history.

(56) References Cited

U.S. PATENT DOCUMENTS

| | | | | |
|---|---|---|---|---|
| 7,624,381 B1* | 11/2009 | Czajkowski | ............. | G06F 8/24 717/108 |
| 7,958,329 B2* | 6/2011 | Holt | ................... | H04L 67/1095 711/100 |
| 8,230,395 B1* | 7/2012 | Koh | ......................... | G06F 8/34 717/121 |
| 8,966,462 B2* | 2/2015 | Gounares | ............. | G06F 9/5016 707/813 |
| 2008/0109592 A1* | 5/2008 | Karamcheti | ........ | G06F 9/5016 711/103 |
| 2008/0184195 A1* | 7/2008 | Lee | ....................... | G06F 8/4434 717/107 |

(Continued)

OTHER PUBLICATIONS

Nakhli et al. "Efficient region-based memory management for resource-limited real-time embedded systems." ICOOOLPS, 2006. Retrieved on [Aug. 15, 2017] Retrieved from the Internet: URL<https://www.researchgate.net/profile/Guillaume_Salagnac/publication/29626074_Efficient_Region-Based_Memory_Management_for_Resource-limited_Real-Time_Embedded_Systems>.*

(Continued)

*Primary Examiner* — Thuy Dao
*Assistant Examiner* — Cheneca Smith
(74) *Attorney, Agent, or Firm* — Fish & Richardson P.C.

(57) ABSTRACT

Implementations of the present disclosure include methods, systems, and computer-readable storage mediums for receiving source code of an application, providing intermediate code based on the source code, the intermediate code including at least one instruction for profiling at least one object of the application, providing a statistics file by processing the intermediate code based on a memory profiling library, processing the statistics file based on a plurality of models to provide a list of objects, the list of objects identifying types of memory respective objects should be stored to in a hybrid main memory system, and storing modified source code that is provided based on the source code and the list of objects.

20 Claims, 5 Drawing Sheets

(56) References Cited

U.S. PATENT DOCUMENTS

| | | | |
|---|---|---|---|
| 2009/0235262 A1* | 9/2009 | Ceze | G06F 9/52 718/102 |
| 2010/0146220 A1* | 6/2010 | Panchenko | G06F 11/3471 711/154 |
| 2010/0192123 A1* | 7/2010 | Carey | G06F 8/30 717/106 |
| 2013/0081005 A1* | 3/2013 | Gounares | G06F 9/5016 717/148 |
| 2015/0169226 A1* | 6/2015 | Shen | G06F 12/0238 711/103 |

OTHER PUBLICATIONS

Li et al. "Strategies for energy-efficient resource management of hybrid programming models." IEEE Transactions on parallel and distributed Systems 24.1 (2013): 144-157. Retrieved on [Aug. 15, 2017] Retrieved from the Internet: URL<http://ieeexplore.ieee.org/stamp/stamp.jsp?arnumber=6171173>.*

Hassan, Ahmad, "Analytical models and techniques for Software-Managed Energy-Efficient Hybrid DRAM/NVM Main Memory," AMC International Conference on Computing Frontiers 2015, May 18-21, 2015, Ischia, Italy.

ACM International Conference on Computing Frontiers 2015, ComputingFrontiers.org, May 18-21, 2015, http://www.computingfrontiers.org/2015, 2 pages.

Bienia et al., "The PARSEC benchmark suite: Characterization and architectural implications," Princeton Univeristy Technical Report TR-811-08, Jan. 2008, 72-81.

Binkert et al., "The GEM5 simulator," SIGARCH Comput. Archit. News, Aug. 2011, 39(2):1-7.

Bovet and Cesati, Understanding the Linux kernel, O'Reilly Media, 2005.

Burger and Austin, "The SimpleScalar Tool Set, Version 2.0," SIGARCH Comput. Archit. News, Jun. 1997, 25(3):13-25.

Burr et al., "Overview of candidate device technologies for storage-class memory," IBM J. Res. and Dev., Jul. 2008, 52(4.5):449-464.

Calder et al., "Cache-conscious data placement," ASPLOS, 1998, 139-149.

Cho et al., "Decoupling local variable accesses in a wide-issue superscalar processor," ISCA, 1999, 100-110.

Dhiman et al., "PDRAM: A hybrid PRAM and DRAM main memory system," DAC, 2009, 664-669.

Doller, "Forging a future in memory: new technologies, new markets, new applications," Hot Chips Tutorials, Jul. 27, 2010, 28 pages.

Dong et al., "NVSim: A circuit-level performance, energy, and area model for emerging nonvolatile memory," TCAD, Jul. 2012, 31(7):994-1007.

Guthaus et al., "A free commercially representative embedded benchmark suite," WWC, 2001, 3-14.

Ho et al., "Nonvolatile memristor memory: Device characteristics and design implications," ICCAD, 2009, 485-490.

Hu et al., "Data allocation optimization for hybrid scratch pad memory with sram and nonvolatile memory," TVLSI, Jun. 2013, 21(6):1094-1102.

Huang and Nagarajan, "ATCache: Reducing DRAM cache latency via a small SRAM tag cache," PACT, 2014:51-60.

Kultursay et al., "Evaluating STT-RAM as a scalable dram alternative," ISPASS, Apr. 2013, 256-267.

Lee and Tyson, "Region-based caching: An energy-delay efficient memory architecture for embedded processors," CASES, 2000, 120-127.

Lee et al., "Architecting phase change memory as a scalable dram alternative," ISCA, 2009, 2-13.

Lee et al., "MediaBench: A tool for evaluating and synthesizing multimedia and communications systems," MICRO, Dec. 1997, 330-335.

Li et al., "Compiler-assisted preferred caching for embedded systems with STT-RAM based hybrid cache," LCTES, 2012, 109-118.

Li et al., "Identifying opportunities for byte-addressable non-volatile memory in extreme-scale scientific applications," IPDPS, 2012, 945-956.

Meza et al., "Evaluating row buffer locality in future non-volatile main memories," SAFARI Technical Report No. 2012-002, Carnegie Mellon University, Dec. 2012, 12 pages.

Micron TN-41-01: Calculating memory system power for DDR3 Introduction, http://www.micron.com/products/support/power-calc, Nov. 2014, 24 pages.

Mogul et al., "Operating system support for NVM+DRAM hybrid main memory," HotOS, 2009, 1-5.

Perez and DeRosa, "Non-volatile memory: Emerging technologies and their impacts on memory systems," Technical report, 2010, 44 pages.

Qureshi et al., "Scalable high performance main memory system using phase-change memory technology," ISCA, 2009, 24-33.

Ramos et al., "Page placement in hybrid memory systems," ICS, 2011, 85-95.

Raoux et al., "Phase-change random access memory: A scalable technology," IBM J. Research and Development, Jul. 2008, 52(4.5):465-479.

Rul et al., "A profile-based tool for finding pipeline parallelism in sequential programs," Parallel Comput., Sep. 2010, 36(9):531-551.

SPEC Benchmark Suite, "Standard Performance Evaluation Corporation," last updated Jul. 2009, retrieved on Oct. 6, 2015, http://www.spec.org/cpu, 2 pages.

"The LLVM compiler infrastructure," retrieved on Oct. 6, 2015, http://llvm.org, 3 pages.

Vandierendonck et al., "On the energy-efficiency of byte-addressable non-volatile memory," Comput. Archit. Letters, 2014, 5 pages.

Wang et al., "Optimizated allocation of data variables to PCM/DRAM-based hybrid main memory for real-time embedded systems," Embedded Systems Letters, IEEE, Sep. 2014, 6(3):61-64.

Yoon, "Row buffer locality aware caching policies for hybrid memories," ICCD, 2012, 337-344.

Zilberberg et al., "Phase-change memory: An architectural perspective," ACM Comput. Surv., Jul. 2013, 45(3):1-29.

* cited by examiner

MANAGED ENERGY-EFFICIENT HYBRID MAIN MEMORY SYSTEMS

BACKGROUND

Enterprises, such as business enterprises, operate enterprise systems to provide software functionality to customers and employees. In some examples, an enterprise system can include back-end enterprise servers that host enterprise applications. Example enterprise applications include enterprise resource planning (ERP) systems, client-relationship management (CRM) systems, product lifecycle management (PLM) systems, supply chain management (SCM) systems, and supplier relationship management (SRM) systems. During operation of an enterprise application, application data is accessed, which is stored in main memory of the enterprise server. In this manner, the application data is immediately accessible by processors of the enterprise server.

Increasingly large amounts of application data are stored in the main memory of enterprise servers. Main memory can include dynamic random access memory (DRAM), which consumes a relatively high amount of static energy (both in active and idle states) due to continuous leakage and refresh power. Various byte-addressable non-volatile memory (NVM) technologies (e.g., memristors) promise near-zero static energy and persistence. However, such NVM can suffer from increased latency and increased dynamic energy.

SUMMARY

Implementations of the present disclosure include computer-implemented methods for allocating object storage in hybrid main memory systems. In some implementations, methods include actions of receiving source code of an application, providing intermediate code based on the source code, the intermediate code including at least one instruction for profiling at least one object of the application, providing a statistics file by processing the intermediate code based on a memory profiling library, processing the statistics file based on a plurality of models to provide a list of objects, the list of objects identifying types of memory respective objects should be stored to in a hybrid main memory system, and storing modified source code that is provided based on the source code and the list of objects.

These and other implementations can each optionally include one or more of the following features: the hybrid main memory system comprises at least dynamic random access memory (DRAM) and non-volatile memory (NVM); the plurality of models includes a performance model and an energy model; the performance model provides average memory access times incurred by memory accesses to respective objects, and the energy model estimates energy gains by placing respective objects on NVM; the list of objects includes a plurality of objects that are sorted in order of increasing memory access time parameter values, and is partitioned based on an index; the modified source code includes at least one prefix that allocates memory on DRAM for a respective object; and the intermediate code includes bit-code.

The present disclosure also provides one or more non-transitory computer-readable storage media coupled to one or more processors and having instructions stored thereon which, when executed by the one or more processors, cause the one or more processors to perform operations in accordance with implementations of the methods provided herein.

The present disclosure further provides a system for implementing the methods provided herein. The system includes one or more processors, and a computer-readable storage medium coupled to the one or more processors having instructions stored thereon which, when executed by the one or more processors, cause the one or more processors to perform operations in accordance with implementations of the methods provided herein.

It is appreciated that methods in accordance with the present disclosure can include any combination of the aspects and features described herein. That is, methods in accordance with the present disclosure are not limited to the combinations of aspects and features specifically described herein, but also include any combination of the aspects and features provided.

The details of one or more implementations of the present disclosure are set forth in the accompanying drawings and the description below. Other features and advantages of the present disclosure will be apparent from the description and drawings, and from the claims.

DESCRIPTION OF DRAWINGS

Like reference symbols in the various drawings indicate like elements.

DETAILED DESCRIPTION

Figure 1:
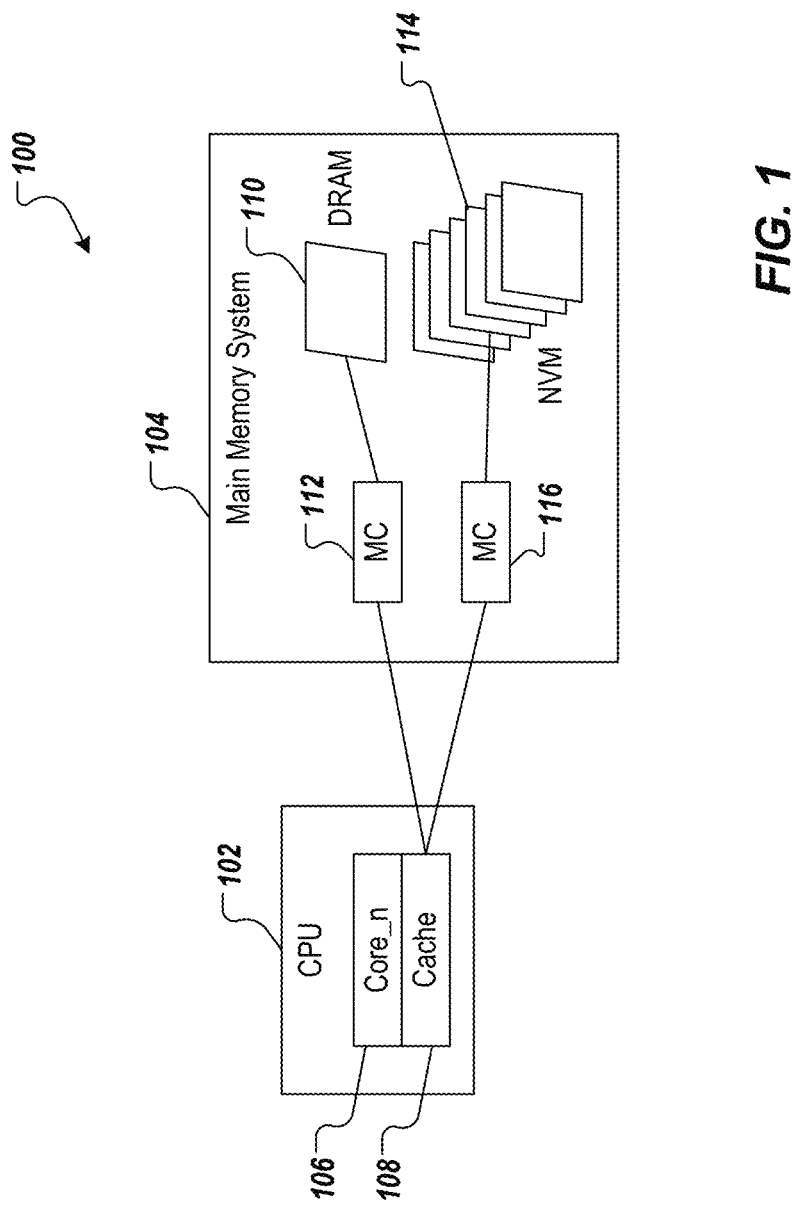
FIG. 1 depicts an example memory architecture in accordance with implementations of the present disclosure.

Implementations of the present disclosure are generally directed to managing hybrid main memory including dynamic random access memory (DRAM) and non-volatile memory (NVM). More particularly, implementations of the present disclosure are directed to a performance model and an energy model for user-level software management of hybrid DRAM/NVM main memory systems. In some implementations, and as described in further detail herein, the performance and energy consumption of an application, with respect to memory requirements, are modeled using first-order analytical models. Implementations of the present disclosure further provide an operating system (OS) and programming interface to store application data to the hybrid memory system. Implementations of the present disclosure also provide a placement tool that can be used by programmers to determine where application data is to be stored in the hybrid memory system.

In some examples, implementations of the present disclosure outperform known page migration techniques. More particularly, software placement in accordance with the present disclosure can provide as much as an 86% reduction of main memory energy, while introducing minimal slowdown (e.g., 3.5% or less). Moreover, the placement tool of the present disclosure can be used to analyze various data granularities for managing hybrid memory systems.

DRAM scaling has been used to address management of application data in main memory of enterprise servers. As there are limits to DRAM scaling, byte-addressable NVM is considered for use in main memory replacement. NVM, however, has certain disadvantages, which can vary between NVM technologies. Generally, disadvantages of NVM include increased latency and dynamic energy for NVM accesses, and reduced memory bandwidth and a fast wear-out of NVM devices as compared to DRAM. NVM, however, also has advantages. For example, NVM will scale to smaller feature sizes and has a significantly decreased lower static energy due to the absence of refresh operations (e.g., approximately 100× lower as compared to DRAM).

Hybrid main memory, including both DRAM and NVM, is implemented to address the disadvantages of NVM. The concept behind hybrid main memory is that a small amount of DRAM holds frequently accessed data (hot data) and provides low latency and low dynamic energy, while a large amount of NVM is used to implement a scalable memory system and store the majority of less frequently accessed data (cold data). Implementations of the present disclosure address determining what data should be placed on what type of memory.

Various caching-based solutions have been proposed, which are implemented by the hardware or the operating system of the enterprise servers. Such solutions try to second-guess the properties of the workloads to be applied to the enterprise server and migrate large chunks of data (e.g., corresponding to the page granularity of the (virtual) memory system) between DRAM and NVM in hybrid main memory. This introduces run-time overhead and energy consumption due to the monitoring and the migration.

Implementations of the present disclosure manage the placement of data in hybrid main memory at the fine granularity of application-level objects. In some examples, an application-level object (object) is an individual program variable and memory allocation. For example, an object can be described as an indivisible unit of memory that can be allocated by an application (e.g., an array, an integer). In accordance with implementations of the present disclosure, operating on objects results in increased energy savings. In some examples, a cumulative distribution function of the difference in energy consumed for a 4 KB page when it is stored on DRAM in comparison to storing the page on resistive random access memory (RRAM) (a type of NVM) has been developed. The cumulative distribution function provides that 61% of pages incur no extra energy, while around 8% of pages are hot data. This leaves 31% of pages in a grey zone. The cumulative distribution function also provides that 91% of objects are cold data and incur no added energy, while 9% of objects are hot data. This analysis shows that objects are a better granularity to decide placement in a hybrid main memory hierarchy, as they are strongly biased towards one particular memory technology (e.g., DRAM vs. NVM).

In accordance with implementations of the present disclosure, pages are found to be less effective for deciding placement, because each page can hold a collection of various small objects, each with a distinct bias. As such, the page itself has no strong preference for a particular type of memory. Moreover, objects are typically short-lived. As such, data migration is too low to adapt to eventual changes in the access patterns of individual objects. Often, there is little need to migrate application-level objects. In contrast, pages are alive throughout the execution of the program and, over time, may hold objects with distinct properties. Page migration is implemented to deal with these fluctuations. Page migration, however, comes at a cost: observing characteristics, learning patterns and reading/writing page-sized chunks of memory.

In accordance with implementations of the present disclosure, there is little need to migrate application-level objects in a set of embedded workloads, which simplifies the design. Results are less pronounced for the complex workloads, where the effectiveness of object placement depends on the number and size of objects. To be precise, page migration performs better than object placement when hot objects are much larger than the page size.

In view of this, implementations of the present disclosure provide a programming interface that enables a programmer to allocate memory either on DRAM or NVM. The programming interface is supported by the operating system and the system libraries of the enterprise server, as described in further detail herein. Implementations of the present disclosure further provide a placement tool that helps programmers to analyze applications and to decide where key application objects should be allocated, as described in further detail herein. In some implementations, the placement tool profiles the application to collect memory access statistics, and applies an analytical energy model to derive a placement for the objects. In some examples, the programmer uses the output of the tool to encode the static placement of application objects on the appropriate memory.

To provide further context, various types of NVM are described in further detail. Example types of NVM include phase-change memory (PCM), spin-transfer torque RAM (STT-RAM) and RRAM. In some examples, NVM memory chips are byte-addressable, non-volatile, require near-zero leakage power, and have density and latency closer to current DRAM technology. Unlike DRAM, however, NVM includes asymmetric read, write, and erase latencies.

In general, PCM exploits the properties of chalcogenide glass when heated and cooled at different speeds. The latency and dynamic energy of PCM, however, is worse as compared to other technologies. In comparison to DRAM, for example, PCM is approximately 2× slower for array read and approximately 43× slower for array write, while leakage power is approximately 1% of DRAM. In general, STT-RAM is a magnetic RAM device that stores data using the orientation of a magnetic field. In some examples, STT-RAM has lower latency than PCM. The dynamic energy and density of STT-RAM is worse than DRAM. STT-RAM, however, has better endurance (e.g., 1015 cycles) as compared to other NVM technologies. In general, RRAM uses measurable change in resistance resulting from the movement of ions to represent 0 or 1. RRAM devices based on memristors are a promising NVM technology for the realization of faster, high density, non-volatile and low power main memory.

FIG. 1 depicts an example memory architecture 100 that can be implemented within an enterprise server. In the example of FIG. 1, the example memory architecture 100 includes a central processing unit (CPU) 102 and a main memory system 104. The CPU 102 includes a core 106 having a respective cache 108. Although a single core and respective cache 108 is depicted, it is appreciated that the CPU 102 can include multiple cores, each with a respective cache. Further, although a single CPU 102 is depicted, it is appreciated that enterprise servers can include multiple CPUs. The main memory system 104 includes DRAM 110 with a respective memory controller (MC) 112, and NVM 114 with a respective MC 116. In some examples, the cache 108 accesses (e.g., read, write, delete) the DRAM 110 through the MC 112, and accesses (e.g., read, write, delete) the NVM 114 through the MC 114.

In some examples, the example memory architecture 100 can be implemented in an in-memory database system. In some examples, an in-memory database system is a database management system that uses main memory for data storage. In some examples, main memory includes random access memory (RAM) that communicates with one or more processors, e.g., central processing units (CPUs), over a memory bus. An in-memory database system can be contrasted with database management systems that employ a disk storage mechanism. In some examples, in-memory database systems are faster than disk storage databases, because internal optimization algorithms can be simpler and execute fewer CPU instructions. In some examples, accessing data in an in-memory database system eliminates seek time when querying the data, which provides faster and more predictable performance than disk-storage databases. In some examples, an in-memory database can be provided as a column-oriented in-memory database, in which data tables are stored as sections of columns of data (rather than as rows of data). An example in-memory database system includes HANA, provided by SAP SE of Walldorf, Germany.

As introduced above, implementations of the present disclosure provide a programming interface (not depicted in FIG. 1). In some implementations, the programming interface exposes the hybrid nature of the main memory system 104 to application programmers. At the hardware level, the DRAM 110 and NVM 114 (e.g., memory chips) are assigned distinct physical address regions. This corresponds to how the basic input/output system (BIOS) reports dual in-line memory module (DIMMs) and their physical address ranges to the OS. In this case, the BIOS also reports the technology used to implement the DIMMs. The OS can select to allocate virtual memory pages on either type of memory, depending on requirements set by the programmer.

Implementations of the present disclosure extend the memory allocation methods to direct the allocation of memory on NVM or on DRAM. For example, for mmap, a function that creates a mapping in the virtual address space of the calling process, implementations provide an option to the flag argument. As another example, for the malloc family of functions, which allocate size bytes and return a pointer to the allocated memory, implementations of the present disclosure provide alternative functions that are prefixed with "hotmem_" (e.g., hotmem_malloc) which have the same arguments, but allocate memory on DRAM. The existing functions implement a default allocation on NVM.

Implementations of the present disclosure also extend the linker file format to provide two versions of each type of data segment. In some examples, for the extensible and linkable format (ELF) file format, a standard file format for executables, object code, shared libraries, and core dumps, the segment .bss_hotmem holds zero-initialized data that is frequently accessed in main memory, while .bss holds the cold data. In some examples, the GNU compiler collection (GCC), a compiler system, annotation "_attribute_((section ("bss_hotmem")))" effects global variable placement.

In some examples, stack data has a very high cache hit rate, often exceeding 99%. As such, main memory accesses are rare for stack data. If objects do attract a high number of repeating memory accesses, the application programmer can explicitly allocate the data to the DRAM.

In some examples, if migration is necessary, the programmer can allocate a new copy of the object on the opposite memory type and copy the data. If memory latency or bandwidth proves to be a bottleneck during migration, it can be sped up with hardware support.

In some implementations, for the OS, allocating memory on a hybrid memory system is similar to allocating memory in a non-uniform memory architecture (NUMA). Here, every NUMA region is further split in a DRAM region and a NVM region. As such, the OS and system libraries can utilize the same memory allocation algorithm for either type of memory. Moreover, virtual memory management and virtual address translation are the same for DRAM and NVM and are unmodified in comparison to a NUMA system.

In some examples, OS implementations of NUMA contain various design decisions that may lead to violation of the programmer's allocation choice (e.g., Linux will not keep track of the NUMA preference of swapped-out pages and may swap them in in the incorrect NUMA partition. Moreover, there may be conflicting constraints when mapping pages into multiple virtual address spaces. These issues are common between NUMA and hybrid memory systems.

Figure 2:
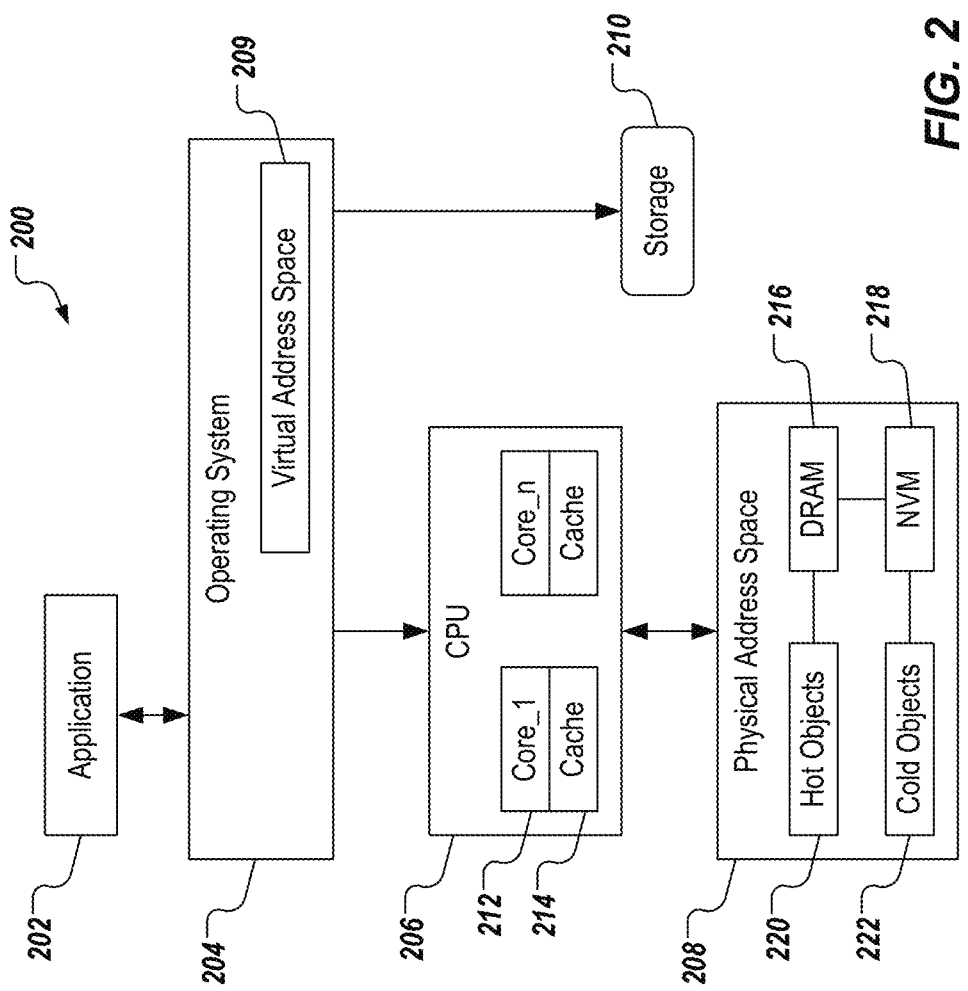
FIG. 2 depicts an example architecture for storing hot data and cold data in accordance with implementations of the present disclosure.

FIG. 2 depicts an example architecture 200 for storing hot data and cold data in accordance with implementations of the present disclosure. In the depicted example, the example architecture 200 includes an application 202, an OS 204, a CPU 206, a physical address space 208, a virtual address space 209, and storage 210. In some examples, execution of the application 202 is coordinated by the OS 204. The CPU 206 includes a plurality of cores 212 (Core_1, . . . , Core_n) with respective caches 214 (e.g., last-level cache (LLC)). In some examples, the CPU 206 coordinates read/write access to the physical address space 208, which is provided as a hybrid main memory (e.g., the main memory system 104 of FIG. 1), described herein. Accordingly, the physical address space 208 includes DRAM 216 and NVM 218 for storing hot objects 220 and cold objects 222, respectively. In some examples, the application 202 is the application, for which data allocations between the DRAM 216 and NVM 218 are to be made. That is, the application 202 is the application that is profiled to provide object statistics, object placement recommendations made based on the object statistics, and modified to achieve at least one of the object placement recommendations, as described in further detail herein. In some examples, the virtual address space 209 is provided as a set of binary addresses that is used by the operating system 204 to allocate memory addresses to any process requesting the memory. In some examples, the virtual address space 209 enables the processes to use more memory addresses than the actual DRAM memory available in the system. In some implementations, the operating system 204 manages the mappings between virtual addresses and physical addresses. In some examples, the storage 210 is provided as hard disk drive that is used for permanent storage of data.

As introduced above, implementations of the present disclosure provide a profiling tool to profile object statistics and an object placement tool that provides recommended placement of objects. In some examples, the profiling tool and the object placement tool are each provided as one or more computer-executable programs that are executed by one or more computers. In some examples, object placement recommendations include individual program variables and memory allocations within the hybrid memory system, which result in reduced energy consumption of the main memory system (e.g., the main memory system 104 of FIG. 1).

In some implementations, the tool uses first-order analytic models of memory access time and energy to estimate the impact of placing an object on DRAM and on NVM. The objective of analytical models is to maximize the energy savings through data placement on the hybrid memory system within a given performance degradation constraint λ (e.g., 5% degradation), which is a user-configurable parameter. These properties are independently determined for each object. In some examples, objects, if placed on DRAM, result in a lower energy consumption than if placed on NVM, are recommended to be placed on DRAM by the object placement tool. In following such a recommendation, the recommended object placement can be encoded into the application (in the source code) by the programmer.

Implementations of the present disclosure further provide for evaluation of the application-level data management on the hybrid main memory system. More particularly, implementations of the present disclosure provide a computer-executable profiling tool to instrument application-defined objects, OS pages and cache blocks. Based on this instrumentation, total memory access, off-chip accesses and lifetime of each data element are measured during operation of the instrumented application. In the profiling of application-defined objects, an object maps one-to-one to global variables, stack-allocated variables and dynamically allocated memory (malloc and mmap) of an application. In some examples, the profiling tool can be easily applied to a wide range of applications, because the profiling tool does not require modifications to source code. The profiling tool enables strategies to be determined for the placement of objects on a hybrid memory system. In some implementations, the profiling tool includes a compile-time instrumentation framework for embedding custom instructions in to the code and a library to perform the memory access analysis on objects.

Figure 3:
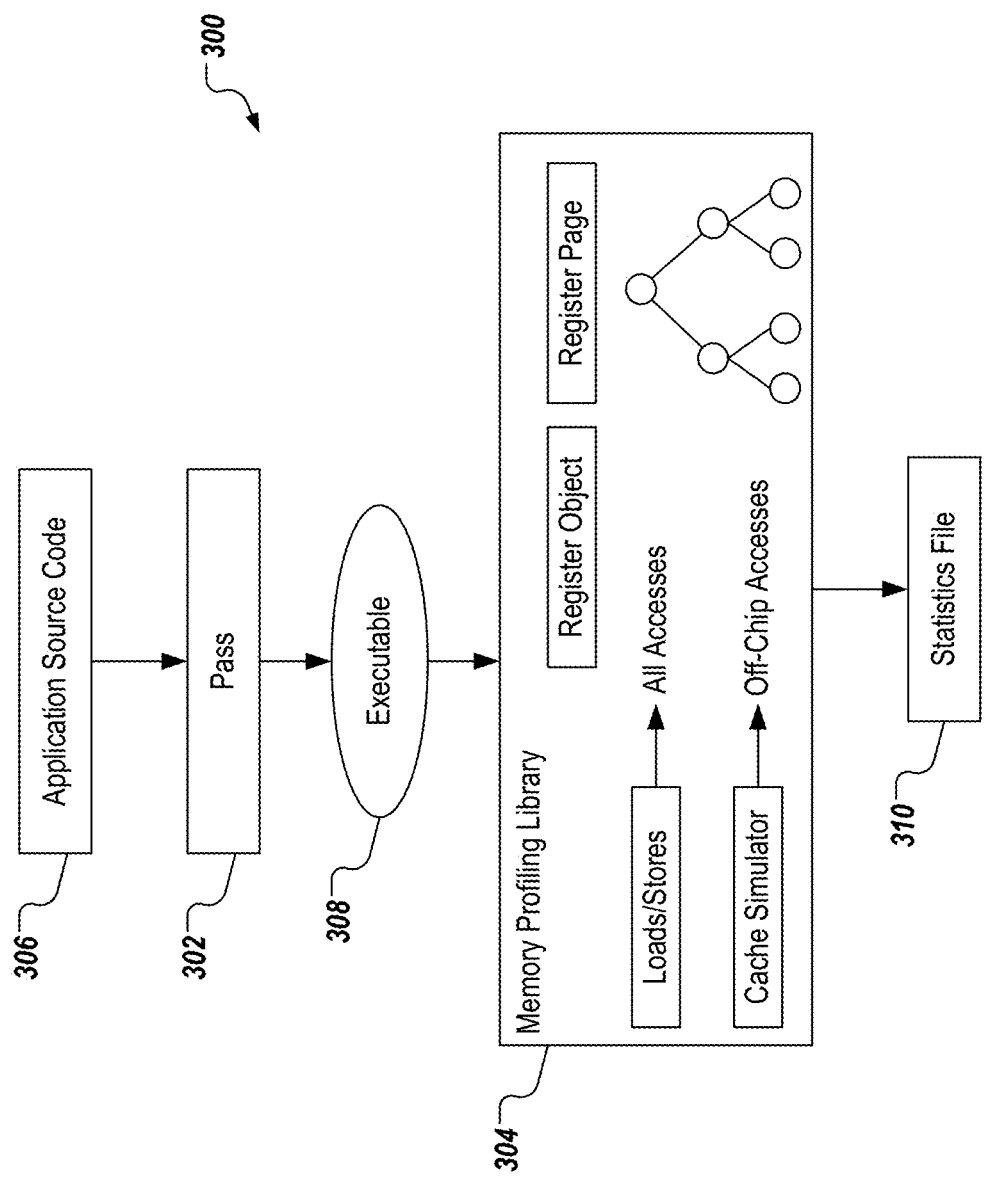
FIG. 3 depicts an example architecture to provide application profiling in accordance with implementations of the present disclosure.

FIG. 3 depicts an example architecture 300 to provide application profiling in accordance with implementations of the present disclosure. In the depicted example, the example architecture 300 includes a pass 302 (e.g., an LLVM pass), and a memory profiling library 304. In some examples, the pass 302 receives application source code 306 (e.g., source code of the application that is to be profiled, and for which object placement recommendations are to be provided), and provides executable code 308. In some examples, the pass 302 compiles the source code and adds instrumentation code to provide the executable code 308. In some examples, the instrumentation code includes instructions to profile the application during execution (e.g., objects, sizes, loads/stores of allocations). In some examples, the executable code 308 is provided as bit-code (e.g., human-readable) and is executed by the memory profiling library 304 to provide a statistics file 310, as described in further detail herein. As also described in further detail herein, the statistics file 310 is provided as input to the placement tool to provide object placement recommendations for the application. In some examples, the statistics file 310 provides an inventory of all objects implicated by the application, sizes of the respective objects, and includes a count of all loads/stores of memory allocations, as well as a mapping of each load/store to a respective object.

In some implementations, the profiling tool uses the compiler framework (e.g., LLVM) to add instrumentation code to the analyzed program. To achieve this, an instrumentation tool is used as pass in a compiler (e.g., LLVM compiler). In some examples, the instrumentation tool takes source code as an input, analyzes the source code, and provides executable bit-code (e.g., human-readable code) with added instrumentation code (as described above with reference to FIG. 3). In some examples, the instrumentation code is executable to identify the creation and destruction of application objects and to record memory accesses. In some examples, global variables, stack variables and dynamically allocated variables are identified through code analysis. In some examples, instrumentation code is added to call a method in the memory profiling library (MPL) to register every allocated variable. For the registration of global variables, MPL calls are added at the beginning of main method. Calls into the MPL are added next to each load and store instruction in the IR to record the memory access.

In some implementations, calls to MPL runtime library include the declaration of statically allocated objects, the (de-)allocation of dynamically allocated stack and heap objects, and the interception of load and store assembly operations. In some implementations, load and store operations are run through a simulator of the on-chip memory hierarchy in order to derive the frequency of cache misses and write-back events occurring for each object.

In some implementations, system libraries are not instrumented. Consequently, calls to common system functions are intercepted at instrumentation time, and the memory accesses performed by these functions are simulated using memory hierarchy simulator. Example intercepted functions include string and memory copy and compare functions (e.g., strcpy) and file I/O (e.g., read). For some functions the (de-) allocation of objects is emulated as a side-effect (e.g., fopen and fclose).

In some implementations, the MPL provides functionality for the memory access analysis. In some examples, the MPL maintains a splay tree, in which each node stores statistics on a respective object. In some examples, a new node is added to the tree with given virtual address range when a new allocation is made in an application. In some examples, the node is removed from tree when the memory is freed for dynamically allocated variables or when stack-allocated variables go out of scope. In some examples, to analyze data management at the granularity of virtual memory pages and blocks, nodes in the splay tree of size 4 KB and 32 bytes, respectively, are used. These nodes are created when load or store operations are performed against them.

In accordance with implementations of the present disclosure, the MPL records the number of reads and writes made to each object, page or block, the number of times the object (or any cache block on which it is stored) is loaded from main memory in to the cache, the number of times a cache block is written back to main memory, the lifetime of each object, the size of each object and the call path. In some examples, in order to obtain the statistics on main memory accesses, the library performs trace-driven cache simulation as the application executes. The profiling tool provides a statistics file, which includes the above-describe records for each object.

In accordance with implementations of the present disclosure, the statistics file of the profiling tool is provided as input to the placement tool. In some implementations, the placement tool processes the records of the statistics file based on the models, as described herein, to provide object placement recommendations.

With respect to the performance model of the placement tool, the first-order performance effect of placing an object on NVM or DRAM is related to the memory access latency and bandwidth, which differ between NVM and DRAM. In some implementations, the performance model only accounts for access latency. For example, bandwidth issues can occur only when objects are frequently accessed, in which case it is already determined to store such objects on DRAM due to the latency benefits. In some implementations, the average memory access time (AMAT) incurred by memory accesses to one object o stored in a memory of technology τ is given by $AMAT_\tau(o)$:

$$AMAT_\tau(o) = \mu_r(o)L_{\tau,r} + (1-\mu_r(o))L_{LLc} \quad (1)$$

where τ is either DRAM or NVM, $L_{\tau,r}$ is the latency to read a cache block in memory, $L_{LLC}$ is the latency to access the last-level cache (LLC), $\mu_r(o)$ is the number of read memory accesses made to o per load or store operation. The example relationship (1) addresses a single-level cache, but can be extended to address multi-level caches.

Besides estimating performance, implementations of the present disclosure estimate the energy impact of storing an object in memory. In some examples, static energy is considered, which is always present throughout the lifetime of an object and includes leakage and refresh energy, and dynamic energy, which is proportional to the frequency of memory accesses. Average memory access energy (AMAE) consumed by an object o is presented by $AMAE_\tau(o)$:

$$AMAE_\tau(o) = \mu_r(o)E_{\tau,r} + \mu w(o)E_\tau + S(o)P_\tau T(o) \quad (2)$$

where, $E_{\tau,r}$ and $E_{\tau,w}$, are the energy for reading and writing, respectively, a cache block to or from memory type T, the parameters $\mu_r(o)$ and $\mu_w(o)$ represent the read access and write accesses to memory, respectively, as in the definition of AMAT, $P_\tau$ is the average leakage power per byte for memory type τ, and the parameters S(o) and T(o) represent the size and lifetime, respectively, of the object o.

With respect to object placement, and in accordance with implementations of the present disclosure, for any object o, an AMAT delta is determined based on the following relationship:

$$\Delta AMAT(o) = AMAT_{DRAM}(o) - AMAT_{NVM}(o) \quad (3)$$

which provides an estimation of the potential slowdown by placing the object on NVM. Further, an AMAE delta is determined based on the following relationship:

$$\Delta AMAE(o) = AMAE_{DRAm}(o) - AMAE_{NVM}(o) \quad (4)$$

which provides an estimation of the energy gain by placing the object on NVM. The latter is typically a function of the trade-off between static and dynamic energy for the object.

In accordance with implementations of the present disclosure, objects are placed such that energy consumption is minimized and latency is increased by no more than a fixed percentage over a DRAM-only system. To this end, objects are sorted in order of increasing ΔAMAT (o) and place objects on DRAM in this order until DRAM is fully occupied. In some examples, the list of sorted objects $o_i$, $1 \leq i \leq N$ is partitioned by splitting the list at index s, such that objects $o_i$, $i \leq s$ are placed on DRAM and objects $o_i$, $i > s$ are placed on NVM. In some examples, the index s is determined in order to meet the expected overall slowdown compared to a DRAM-only memory system:

$$\sum_{i=s+1}^{N} \Delta AMAT(o_s) \leq \lambda \sum_{i=1}^{N} AMAT_{dram}(o_s) \quad (5)$$

where λ is a user-configurable parameter (e.g., 5%). This algorithm works well, because ΔAMAE (o) correlates with ΔAMAT (o). This happens, for example, because systems with small memory capacities tend to be dominated by dynamic energy. As such, both quantities depend mostly on the number of memory accesses. If this correlation is absent, more complex partitioning algorithms may be used.

In some implementations, the placement tool provides a list of objects and corresponding placement recommendations for the particular application (e.g., the application profiled by the profiling tool). The programmer uses the list of objects to modify the source code of the application to achieve at least some of the object placement recommendations. For example, the programmer can modify the original source code to introduce prefixes to direct the allocation of memory on NVM or on DRAM (e.g., hotmem_malloc), as described in detail herein.

Figure 4:
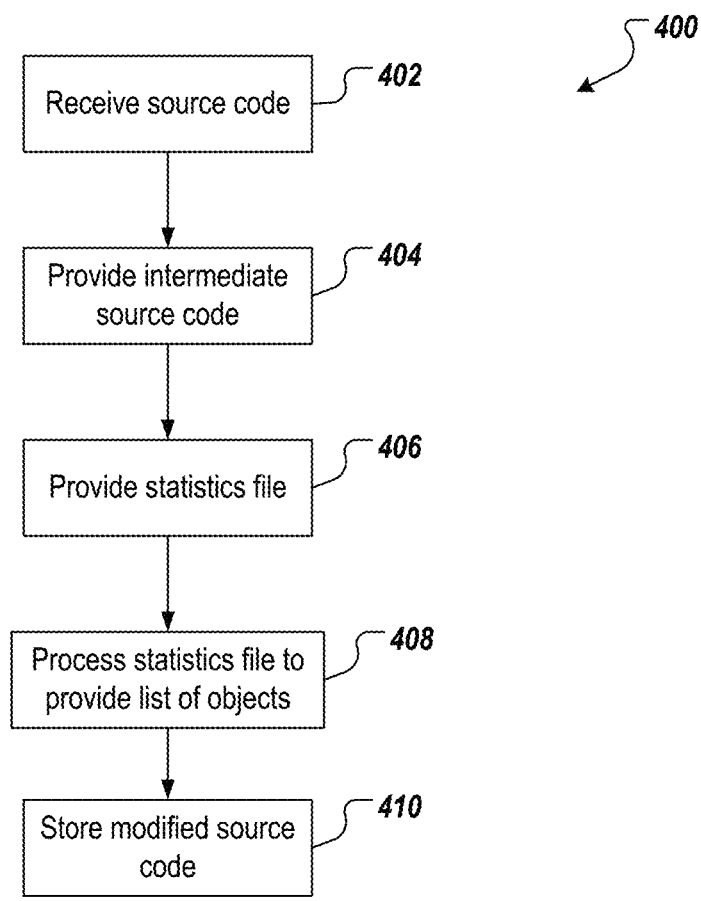
FIG. 4 depicts an example process that can be executed in accordance with implementations of the present disclosure.

FIG. 4 depicts an example process 400 that can be executed in accordance with implementations of the present disclosure. In some implementations, the example process 400 can be realized using one or more computer-executable programs executed using one or more computing devices.

Source code of an application is received (402). For example, the profiling tool can receive the source code of the application. Intermediate code is provided based on the source code (404). For example, a pass (e.g., LLVM pass) of the profiling tool can provide the intermediate code based on the source code, as described herein. In some examples, the intermediate code includes at least one instruction for profiling at least one object of the application. A statistics file is provided (406). For example, the profiling tool processes the intermediate code based on a memory profiling library to provide the statistics file, as described herein. The statistics file is processed to provide a list of objects (408). For example, an object placement tool processes the statistics file based on a plurality of models to provide the list of objects, as described herein. In some examples, the list of objects identifies types of memory respective objects should be stored to in a hybrid main memory system. Modified source code is stored (410). For example, the modified source code is provided based on the source code and the list of objects. In some examples, the modified source code includes at least one prefix that allocates memory on DRAM for a respective object.

Figure 5:
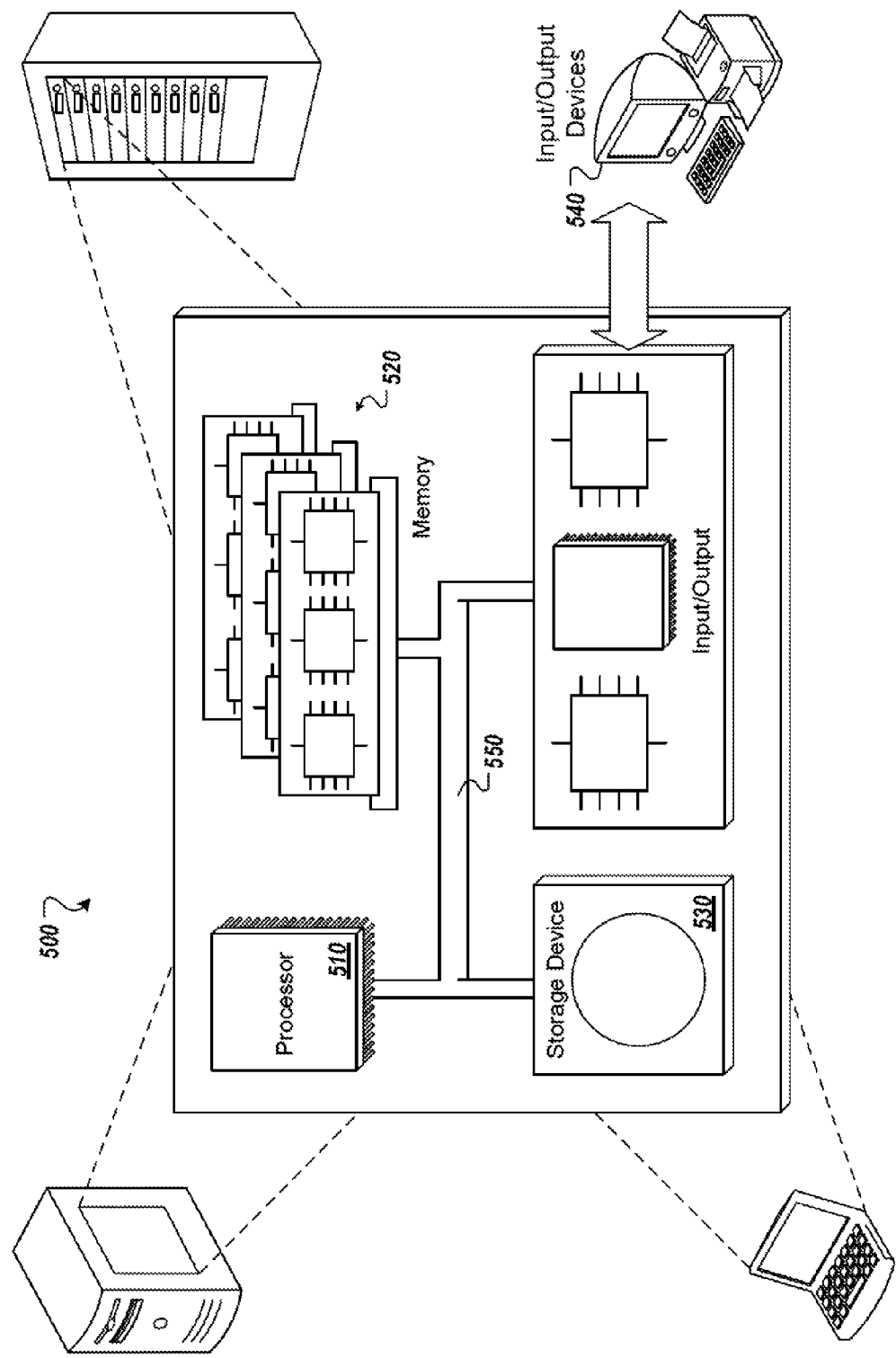
FIG. 5 is a schematic illustration of example computer systems that can be used to execute implementations of the present disclosure.

Referring now to FIG. 5, a schematic diagram of an example computing system 500 is provided. The system 500 can be used for the operations described in association with the implementations described herein. For example, the system 500 may be included in any or all of the server components discussed herein. The system 500 includes a processor 510, a memory 520, a storage device 530, and an input/output device 540. Each of the components 510, 520, 530, 540 are interconnected using a system bus 550. The processor 510 is capable of processing instructions for execution within the system 500. In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit. The storage device 530 is capable of providing mass storage for the system 500. In one implementation, the storage device 530 is a computer-readable medium. In various different implementations, the storage device 530 may be a floppy disk device, a hard disk device, an optical disk device, or a tape device. The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier (e.g., in a machine-readable storage device) for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. Elements of a computer can include a processor for executing instructions and one or more memories for storing instructions and data. Generally, a computer can also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

A number of implementations of the present disclosure have been described. Nevertheless, it will be understood that various modifications may be made without departing from the spirit and scope of the present disclosure. Accordingly, other implementations are within the scope of the following claims.

What is claimed is:

1. A computer-implemented method executed by one or more processors, the method comprising:
    receiving, by one or more processors, source code of an application comprising a plurality of objects;
    providing, by the one or more processors, an intermediate code based on the source code, the intermediate code being executable to identify creation and destruction of the plurality of objects and comprising at least one instruction for profiling at least one object of the application by providing at least one of a count of all loads/stores of memory allocations and a mapping of each load/store operation of the at least one object;
    providing, by the one or more processors, a statistics file by processing the intermediate code based on a memory profiling library that maintains a splay tree, in which each node of the splay tree stores statistics on a respective object, the statistics file comprising records of memory access statistics for each of the plurality of objects;
    processing, by the one or more processors, the statistics file based on a plurality of models to provide a list of objects, the list of objects identifying types of memory respective objects should be stored to in a hybrid main memory system; and
    storing, by the one or more processors, modified source code that is provided based on the source code and the list of objects.

2. The method of claim 1, wherein the hybrid main memory system comprises at least dynamic random access memory (DRAM) and non-volatile memory (NVM).

3. The method of claim 1, wherein the plurality of models comprises a performance model and an energy model.

4. The method of claim 3, wherein the performance model provides average memory access times incurred by memory accesses to respective objects, and the energy model estimates energy gains by placing respective objects on NVM.

5. The method of claim 1, wherein the list of objects comprises a second plurality of objects that are sorted in order of increasing memory access time parameter values, and is partitioned based on an index.

6. The method of claim 1, wherein the modified source code comprises at least one prefix that allocates memory on DRAM for the respective object.

7. The method of claim 1, wherein the intermediate code comprises bit-code.

8. A non-transitory computer-readable storage medium coupled to one or more processors and having instructions stored thereon which, when executed by the one or more processors, cause the one or more processors to perform operations comprising:

receiving source code of an application comprising a plurality of objects;

providing an intermediate code based on the source code, the intermediate code being executable to identify creation and destruction of the plurality of objects and comprising at least one instruction for profiling at least one object of the application by providing at least one of a count of all loads/stores of memory allocations and a mapping of each load/store operation of the at least one object;

providing a statistics file by processing the intermediate code based on a memory profiling library that maintains a splay tree, in which each node of the splay tree stores statistics on a respective object, the statistics file comprising records of memory access statistics for each of the plurality of objects;

processing the statistics file based on a plurality of models to provide a list of objects, the list of objects identifying types of memory respective objects should be stored to in a hybrid main memory system; and storing modified source code that is provided based on the source code and the list of objects.

9. The non-transitory computer-readable storage medium of claim 8, wherein the hybrid main memory system comprises at least dynamic random access memory (DRAM) and non-volatile memory (NVM).

10. The non-transitory computer-readable storage medium of claim 8, wherein the plurality of models comprises a performance model and an energy model.

11. The non-transitory computer-readable storage medium of claim 10, wherein the performance model provides average memory access times incurred by memory accesses to respective objects, and the energy model estimates energy gains by placing respective objects on NVM.

12. The non-transitory computer-readable storage medium of claim 8, wherein the list of objects comprises a second plurality of objects that are sorted in order of increasing memory access time parameter values, and is partitioned based on an index.

13. The non-transitory computer-readable storage medium of claim 8, wherein the modified source code comprises at least one prefix that allocates memory on DRAM for the respective object.

14. The non-transitory computer-readable storage medium of claim 8, wherein the intermediate code comprises bit-code.

15. A system, comprising:
a computing device; and
a computer-readable storage device coupled to the computing device and having instructions stored thereon which, when executed by the computing device, cause the computing device to perform operations comprising:

receiving source code of an application comprising a plurality of objects;

providing an intermediate code based on the source code, the intermediate code being executable to identify creation and destruction of the plurality of objects and comprising at least one instruction for profiling at least one object of the application by providing at least one of a count of all loads/stores of memory allocations and a mapping of each load/store operation of the at least one object;

providing a statistics file by processing the intermediate code based on a memory profiling library that maintains a splay tree, in which each node of the splay tree stores statistics on a respective object, the statistics file comprising records of memory access statistics for each of the plurality of objects;

processing the statistics file based on a plurality of models to provide a list of objects, the list of objects identifying types of memory respective objects should be stored to in a hybrid main memory system; and storing modified source code that is provided based on the source code and the list of objects.

16. The system of claim 15, wherein the hybrid main memory system comprises at least dynamic random access memory (DRAM) and non-volatile memory (NVM).

17. The system of claim 15, wherein the plurality of models comprises a performance model and an energy model.

18. The system of claim 17, wherein the performance model provides average memory access times incurred by memory accesses to respective objects, and the energy model estimates energy gains by placing respective objects on NVM.

19. The system of claim 15, wherein the list of objects comprises a second plurality of objects that are sorted in order of increasing memory access time parameter values, and is partitioned based on an index.

20. The system of claim 15, wherein the modified source code comprises at least one prefix that allocates memory on DRAM for the respective object.

* * * * *